May 28, 1968 L. W. PRIDDY 3,386,053
SIGNAL CONVERTER CIRCUITS HAVING CONSTANT
INPUT AND OUTPUT IMPEDANCES
Filed April 26, 1965

INVENTOR.
LLOYD W. PRIDDY
BY Bruce C Lutz
ATTORNEY 3,386,053

SIGNAL CONVERTER CIRCUITS HAVING CONSTANT INPUT AND OUTPUT IMPEDANCES

Lloyd W. Priddy, Mahtomedi, Minn., assignor to Honeywell Inc., Minneapolis, Minn., a corporation of Delaware Filed Apr. 26, 1965, Ser. No. 450,930
11 Claims. (Cl. 332—31)

ABSTRACT OF THE DISCLOSURE

Signal converting circuitry for modulating-demodulating input signals while maintaining constant input and outut impedances.

Figure 1:
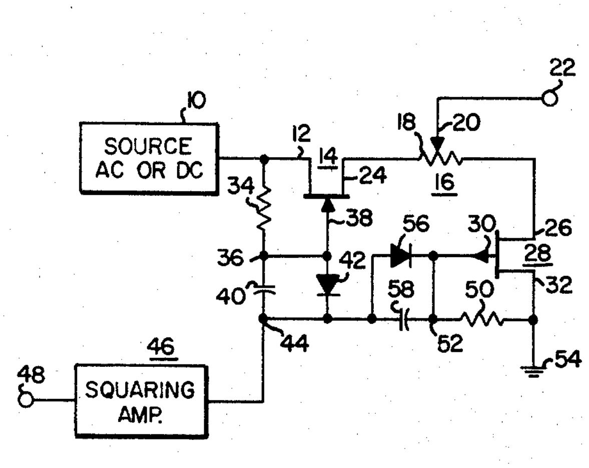

This invention pertains generally to transistor circuitry and more particularly to improved modulator and demodulator circuit design.

Prior art modulators and demodulators have suffered from a number of deficiencies. One of the deficiencies being that an offset or error output voltage will often appear during the time period when the demodulator is supposed to be switched to an OFF condition and no output signal is supposed to be provided. The apparatus receiving this signal will of course integrate it into the results of the signal received during the time the switch is ON and thus provide erroneous information. A second source of trouble in prior art demodulators lies in the fact that the impedence looking back from the output terminal is quite often varied depending upon whether the switches in the half-wave version are in an OFF or an ON condition. The same problem of variation in impedance occurs looking into the demodulator and therefore there is a variation in drain current from the source of signal whether it be a DC source being modulated or an AC source being demodulated.

The two embodiments of this invention which are illustrated each solve one or more of the above mentioned problems. It is therefore an object of this invention to provide improved modulating and demodulating apparatus.

Figure 2:
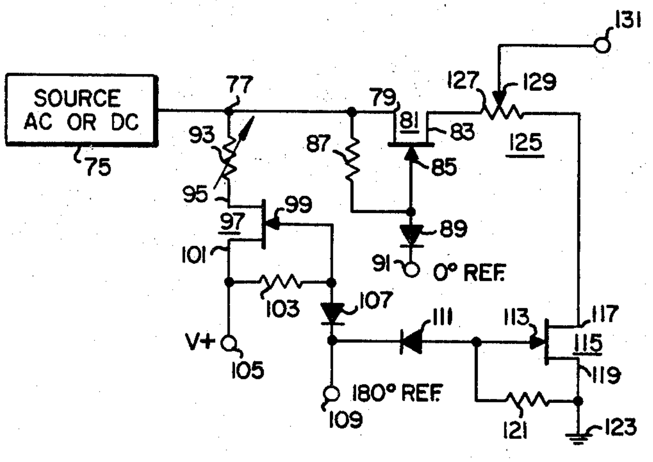

Further objects and advantages of the present invention may be ascertained from a reading of the specification and claims in conjunction with the drawing in which:

FIGURE 1 is a schematic diagram of a simplified version of the modulator-demodulator apparatus; and FIGURE 2 is a schematic diagram of a somewhat more advanced version of the modulating-demodulating apparatus for higher accuracy applications.

In FIGURE 1 a signal source 10 supplies an output signal to a source electrode 12 of an N-channel field effect transistor (FET) 14. A variable potentiometer 16 has a resistance element 18 and a wiper 20. The wiper 20 is connected to an output terminal 22 while the resistance element 18 is connected between a drain electrode 24 of the FET 14 and a source 26 of a P-channel FET 28 having a gate 30 and a drain 32. A resistor 34 is connected between source 12 and a junction point 36 which is further connected to a gate 38 of FET 14. A capacitor 40 and a diode 42 are connected in parallel between junction point 36 and junction point 44 which serve as an output terminal of a squaring amplifier generally designated as 46 and which has an input 48. A resistor 50 is connected between drain 32 of FET 28 and a junction point designated as 52. The drain 32 is further connected to ground or reference potential 54. A diode 56 is connected in parallel with a capacitor 58 between the junction point 44 and junction point 52. The diode 42 is connected such that its direction of easy current flow is toward junction point 44 while the diode 56 is connected so that the direction of easy current flow is away from junction point 44.

FIGURE 2 is very similar to FIGURE 1 with the exception that all the FETs are of the N-type channel material and there is compensation to allow the input impedence to remain constant throughout the use of the apparatus. However, the various portions will be given new numbers even though they are basically the same as in FIGURE 1. A signal source 75 has an output connected to a junction point 77 which is further connected to a source 79 of a FET generally designated as 81 further having a drain 83 and a gate 85. A resistor 87 is connected between junction point 77 and gate 85. A diode 89 is connected between gate 85 and a 0° reference switching signal input terminal 91 such that the direction of easy current flow is toward terminal 91. A resistor 93 is connected between junction point 77 and a source 95 of a FET generally designated as 97 and having a gate 99 and a drain 101. A resistor 103 is connected between drain 101 which is further connected to a source of positive voltage 105 and gate 99. A diode 107 is connected between gate 99 and a source of $\pi$ phase or 180° reference switching signal voltage 109. A diode 111 is connected between terminal 109 and a gate 113 of a FET generally designated 115 and having a source 117 and a drain 119. Diodes 107 and 111 are both connected so that the direction of easy current flow is toward terminal 109. A resistor 121 is connected between gate 113 and ground or reference potential 123. Ground 123 is further connected to drain 119 of FET 115. A variable resistance or potentiometer generally designated at 125 has a resistance element 127 connected between drain 83 and source 117 of FETs 81 and 115 respectively. Potentiometer 125 also has a wiper 129 connected to an output terminal 131. As will be realized the 0 and 180° reference voltage could easily be supplied from a differential squaring amplifier which with a single input signal would provide two output signals 180° out of phase.

While in the above description of the contents of this circuit the various FETs have been described as transistors, it will be realized that any other semi-conductor switches may be used to practice the invention along with other types of electronic switches and therefore it is within the scope of the invention to use terminology for these FETs such as valve means, gate means, variable impedance means, switch means, and semiconductor switching elements. Further, the resistive elements have been designated as resistors for convenience and it is conceivable that other types of impedence elements may be used in some situations. As will be noted, the two FETs in FIGURE 1 could be of the same channel type by merely applying opposite phase signals to the diodes 42 and 56 and further connecting them to have their direction of easy current flow the same way. Likewise, the apparatus of FIGURE 2 could use a single input signal by merely making the FET 81 the opposite conductivity type of FETs 97 and 115 and changing the diode 89 accordingly.

OPERATION

Before attempting to describe the circuitry of FIGURE 1 some of the fundamentals of FETs when used as switches should be stated. An FET is in an open condition when no signal is applied thereto. In other words the drain and the source have a low impedance connection therebetween. When a signal is applied to the gate, the impedance is increased between the source and the drain until it becomes a maximum. The circuitry of FIGURE 1 will work at least marginally even if the resistors 34 and 50 and the capacitors 40 and 58 are removed. However, with the FETs connected in this manner (the named resistors and capacitors removed) the FETs will amplify noise signals and other extraneous signals when the diode 42 is back biased prior to the time the internal capacitance of FET 14 is discharged. Since there is no discharge path, the FET will have to discharge through the leakage path of diode 42. This will take a considerable period of time and there will be a large amount of noise in the output. The addition of resistor 34 would prevent the gate 38 from floating and adding noise signals when diode 42 is back biased but will tend to load down the source 10 if 34 is a low impedance. If resistor 34 is a high impedance, the capacitance internal to FET 14 will still take a long time to discharge even though this time is quite short as compared to removing the resistor entirely. If source 10 can be loaded and not produce detrimental effects, the resistor 34 can be made quite small to allow a quick discharge of the internal capacitance of FET 14 and everything will be satisfactory. However, if source 10 can not be loaded, it may be necessary to include the capacitor 40. Capacitor 40 will provide an extra "kick" on the positive half cycle input from squaring amplifier 46 to supply current of a positive value to charge the internal capacitance of FET 14 and therefore allow FET 14 to turn to an ON condition and pass current therethrough. When the output from the squaring amplifier suddenly goes negative, the capacitor 40 will lower the potential of gate 38 and absorb current from the internal capacitance of FET 14 so as to discharge this internal capacitance more quickly. As will be noted, a resistor which functions in a manner similar to that of resistor 34 is used with all the rest of the FET's in this invention. The capacitor similar to that of capacitor 40 is used only in FIGURE 1 although they could be used in FIGURE 2 if desired in some applications. However, FIGURE 2 has an additional function which eliminates part of the requirement of a large impedance for resistor 34 and thus in some applications can do away with the requirement for a capacitor similar to that of capacitor 40.

In the operation of FIGURE 1 as a demodulator, an alternating signal is supplied from source 10 and a switching signal is supplied from squaring amplifier 46. The switching signal will turn FET 14 ON at the same instant that FET 28 is turned OFF. Thus when the signal at junction point 44 is positive, FET 14 will be ON and pass a signal from source 10 to the output 22 and when the signal is negative at 44 the output 22 will be connected directly to ground 54 through FET 28. A resistor could be used between drain 24 and ground 54 to provide a somewhat stable impedance looking back into the demodulator but this would have to be an impedance such that there would be no appreciable change in the impedance seen by the load. This would mean that the resistance between drain 24 and ground would be of a low value as compared with the output impedance of source 10. If this were of a low value, the load current from source 10 would be very large when FET 14 is in an ON condition and there would be an offset voltage at 22 due to leakage currents through FET 14 when it is in the OFF condition. The circuit as shown eliminates or substantially reduces this change in impedance looking into the demodulator from output 22 since the wiper 20 of potentiometer 16 is adjusted so that the impedance looking into output terminal 22 is the same whether FET 14 or FET 28 is in an ON condition. Thus the source of demodulated signals presents a constant output impedance and the load is not affected. Further there is no appreciable load on source 10 when FET 14 is ON since the impedance of FET 28 is very high at this time due to its OFF condition.

When this circuit of FIGURE 1 is used as a modulator, the circuit conditions are exactly the same except that the input is either a slowly varying direct or alternating voltage or else a high frequency carrier as compared to the frequency of the switching or reference voltage applied to terminals 48. In any event the operation of the circuit is exactly the same.

It may thus be observed that this is a very simple circuit for universal use as a demodulator or modulator without any changes whatsoever.

FIGURE 2 provides an improved version for high accuracy applications where the circuitry of FIGURE 1 is such that too much of a load is placed on source 75. It is also used where the source 75 can stand a large load current but where it can not tolerate alterations in load current, in other words, where source 75 should not be subjected to load impedance variations. The operation of FETs 81 and 115 are substantially the same as the operation of corresponding FETs 14 and 28 in FIGURE 1 with the exception that in FIGURE 2 the FETs are on the same N-channel type and therefore must have opposite polarity switching signals applied thereto. When a negative signal is applied to FET 81, there will be a drain current flowing from source 75 through resistor 87, diode 89 and out terminal 91 to the source of the switching signal. When the input to terminal 91 is positive, diode 89 is back biased and this source of current flow is no longer in existence. However, at this time there will be a current flow from source 75 through FET 81 to the load attached to terminal 131. One way to minimize the current flow variations from source 75 would be to insert a signal into the circuit during the times that FET 81 is OFF which is equal to the current flow through resistor 87. This can be accomplished by connecting FET 97 to a source of positive potential and switching it to an ON condition when FET 81 is switched OFF. The resistor 93 can then be adjusted or selected so that there is a current flow from terminal 105 through FET 97, resistor 93, resistor 87, diode 89, and to the source of reference signal connected to terminal 91. However, there would still be a variation in load current from source 75 which would be the difference between the current flowing to the load when FET 81 is ON and the absence of current when FET 81 is OFF. To correct this, the value of resistance 93 in combination with the ON impedance of FET 97 can be adjusted such that this current plus the current from source 75 through the load when FET 81 is ON is the same as the current which would flow through resistor 87 when FET 81 is in the OFF condition. Thus, the current flow from source 75 would be the same whether FET 81 were in the OFF or ON condition and there is no variation in the load current from source 75. As previously explained in connection with FIGURE 1, source 75 can provide either alternating voltage for demodulation or direct voltage or current for modulating purposes. Also, if there is a variation in frequency between source 75 and switching signals applied to terminals 91 and 109, an alternating signal can be modulated in a manner similar to that of modulating a carrier frequency in transmission or communication applications.

While two embodiments have been described, it will be realized by those skilled in the art that many individual variations of the basic circuit shown can be designed and I wish to be limited only by the appended claims wherein I claim:

1. Signal converting means wherein the input and output impedances remain substantially constant comprising, in combination:
- signal input means for supplying input signals;
- switching input means for supplying switching signals;
- output means for supplying output signals indicative of said input and switching signals;
- reference potential means;
- variable impedance means connected to said output means and having first and second inputs whereby the impedance between said output means and the first input means of said variable means is increased as the impedance between said output means and the second input means of said variable impedance means is decreased;

first FET switching means connected between said signal input means and the first input means of said variable impedance means for providing first and second conductivity conditions therebetween and connected to said switching input means to receive the switching signals therefrom, said first FET switching means changing between conductivity states in response to corresponding changes of the switching signals received;

second FET switching means connected between said reference potential means and the second input means of said variable impedance means for providing first and second conductivity conditions therebetween and connected to said switching input means to receive a signal therefrom, said first FET switching means changing between conductivity states in response to corresponding changes of a switching signal received from said switching input means, the conductivity states of said second FET switching means being opposite the conductivity states of said first FET switching means;

current supplying means;

third FET switching means connected between said signal input means and said current supplying means and connected to said switching input means for receiving switching signals therefrom and changing conductivity states in response thereto, said third FET switching means supplying a current to said input means when said first FET switching means is in said first condition which is substantially equal to the difference between the current flow from said input means when said first FET switching means is in the first and second conductivity conditions and when said third FET switching means is removed to stabilize the apparent impedance at said input means.

2. Signal converting means comprising, in combination:

input signal supplying means;

switching signal supplying means;

output means for suplying output signals;

reference potential means;

variable impedance means connected to said output means and having first and second inputs whereby the impedance betwen said output means and the first input means and second input means of said variable means varies inversely;

first switching means connected between said input signal supplying means and the first input means of said variable impedance means for providing first and second conductivity conditions therebetween and connected to said switching signal supplying means to receive switching signals therefrom, said first switching means changing between conductivity states in response to corresponding changes of the switching signals received;

second switching means connected between said reference potential means and the second input means of said variable impedance means for providing first and second conductivity conditions therebetween and connected to said switching signal supplying means to receive a signal therefrom, said first switching means changing between conductivity states in response to corresponding changes of a switching signal received from said switching signal supplying means, the conductivity states of said second switching means being opposite the conductivity states of said first switching means;

current supplying means;

third switching means connected between said input signal suplying means and said current supplying means and connected to said switching signal supplying means for receiving switching signals therefrom and changing conductivity states in response thereto, said third switching means supplying a current to said input means when said first switching means is in said first condition which is substantially equal to the differential current flow if said third switching means were removed to stabilize the apparent impedance at said input means.

3. Signal demodulating means having substantially constant input and output impedance comprising, in combination:

input means for supplying an input signal;

output means for providing a converted output signal;

periodically switched first gate means connected between said input means and said output means for alternately limiting and permitting signal flow therebetween;

means for supplying current to said input means only when said gate means is limiting signal flow to reduce variations in effective input impedance connected to said input means; and second gate means connecting an impedance to said output means when said first gate means is limiting signal flow therethrough to reduce variations in effective output impedance at said output means.

4. Switching circuitry including signal input means switching input means, reference potential means and output means wherein it is desired that the output impedance be kept substantially constant comprising, in combination:

variable impedance means connected to said output means of the switching circuitry and having first and second inputs whereby the impedance between said output means and the first input means of said variable means is increased as the impedance between said output means and the second input means of said variable impedance means is decreased;

first FET switching means connected between said signal input means and the first input means of said variable impedance means for providing first and second conductivity conditions therebetween and connected to said switching input means to receive a signal therefrom, said first FET switching means changing between conductivity states in response to corresponding changes of a switching signal received from said switching input means; and second FET switch means connected between said reference potential means and the second input means of said variable impedance means for providing first and second conductivity conditions therebetween and connected to said switching input means to receive a signal therefrom, said first FET switching means changing between conductivity states in response to corresponding changes of the switching signal received from said switching input means, the conductivity states of said second FET switch means being opposite the conductivity states of said first FET switching means to provide a path to said reference potential means at all times.

5. Switching circuitry including signal input means, switching input means, reference potential means and output means comprising, in combination:

variable impedance means connected to said output means of the switching circuitry and having first and second inputs whereby the impedance between said output means and the first and second input means of said variable means is varied inversely;

first switching means connected between said signal input means and the first input means of said variable impedance means for providing first and second conductivity conditions therebetween and connected to said switching input means to receive a signal therefrom, said first switching means changing between conductivity states in response to corresponding changes of a switching signal received from said switching input means; and second switching means connected between said reference potential means and the second input means of said variable impedance means for providing first and second conductivity conditions therebetween and connected to said switching input means to receive a signal therefrom, said first switching means changing between conductivity states in response to corresponding changes of the switching signal received from said switching input means, the conductivity states of said second switching means being opposite the conductivity states of said first switching means.

6. Apparatus of the class described comprising, in combination:
first means for supplying a first input signal;
second means for supplying a second input signal to be used as a switching signal;
output means for supplying an output signal which is a function of said first and second signals;
potentiometer means having a wiper connected to said output means;
reference potential means;
first and second field effect transistor means each connected to said potentiometer means whereby said first and second field effect transistor means and said potentiometer means are connected in series and whereby said first and second transistor means are connected to said first means and said reference potential means respectively; and
third means connecting said second means to said first and second field effect transistor means for applying said second input signal thereto, said first and second transistor means being in opposite conductivity conditions at a given time.

7. Apparatus of the class described comprising, in combination:
first means for supplying a first input signal;
second means for supplying a second input signal to be used as a switching signal;
output means for obtaining an output signal which is a function of said first and second signals;
variable impedance means having a tap connected to said output means;
reference potential means;
first and second field effect transistor means each connected to said impedance means whereby said field effect transistor means and said impedance means are connected in series and at opposite ends of said potentiometer means between said first means and said reference potential means; and
third means connecting said second means to said first and second field effect transistor means for applying said second input signal thereto, said first and second transistor means being in opposite conductivity conditions at a given time.

8. Apparatus of the class described comprising, in combination:
first means for supplying a first input signal;
second means for supplying a switching signal;
output means for supplying an output signal which is a function of said first and second signals;
impedance means having a tap connected to said output means;
reference potential means;
first and second valve means each connected to said impedance means whereby said valve means and said impedance means are connected in series and at opposite ends of said impedance means between said first means and said reference potential means; and
third means connecting said second means to said first and second valve means for applying said second input signal thereto, said first and second valve means being in opposite conductivity conditions at a given time.

9. Improved half wave modulator-demodulator apparatus having reference potential means, means for supplying a periodic switching signal, switch means connected between signal input and signal output means, said switch means having control means connected to said means for supplying a periodic switching signal, said switch means alternating between conductive and non-conductive conditions in accordance with said periodic switching signal, wherein the impedance between said signal output means and said reference potential means is subject to variation as said switch means is periodically rendered conductive and non-conductive, wherein the improvement comprises:
valve means having control means connected to said means for supplying a periodic switching signal, said valve means alternating between conductive and non-conductive conditions in accordance with said periodic switching signal and in phase opposition to the conductivity state of said switch means;
variable impedance means including end means and wiper means;
means connecting said end means of said variable impedance means and said valve means in series between said signal output means and said reference potential means; and
improved signal output means connected to said wiper means, wherein said wiper means is adjustable to produce a substantially constant impedance with respect to said reference potential means at said improved signal output means.

10. Half-wave modulator-demodulator apparatus comprising, in combination:
reference potential means;
input signal means for connecting a source supplying a signal to be modulated or demodulated, said source having a characteristic series output impedance;
output signal means;
impedance means including first and second end means and wiper means, the impedance between said wiper means and said first and second end means varying inversely upon adjustment of said wiper means between said first and second end means;
first switch means connected between said input signal means and said first end means of said impedance means, said first switch means having control means;
second switch means connected between said second end means of said impedance means and said reference potential means, said second switch means having control means;
means connected to said control means for turning said first and second switch means OFF and ON alternately and periodically in phase opposition; and
means connecting said wiper means to said output signal means for providing a substantially constant output impedance with respect to said reference potential means through adjustment of said wiper means.

11. In half-wave modulator-demodulator apparatus wherein a series semiconductor switch is used in combination with a biasing impedance whereby the current drawn by the combination varies between two conductivity states of the semiconductor switch so as to alter the effective input impedance, the method of stabilizing the apparent input impedance comprising the step of adding a current to the apparatus input current, substantially equal to the difference in currents drawn by the combination, during the conductivity state when the combination requires the greatest amplitude current flow.

References Cited

UNITED STATES PATENTS

| | | | |
|---|---|---|---|
| 2,840,699 | 6/1958 | Carpenter | 329—101 X |
| 2,863,123 | 12/1958 | Koch | 332—31 |
| 3,160,767 | 12/1964 | Tindall | 307—885 |
| 3,189,846 | 6/1965 | Millis et al. | 329—101 X |
| 3,229,218 | 1/1966 | Sickles et al. | 307—885 |

ALFRED L. BRODY, *Primary Examiner.*